US009014769B2

(12) United States Patent
Harrison

(10) Patent No.: US 9,014,769 B2

(45) Date of Patent: Apr. 21, 2015

(54) CRYOCOOLER SYSTEM AND SUPERCONDUCTING MAGNET APPARATUS HAVING THE SAME

(71) Applicant: Samsung Electronics Co., Ltd., Gyeonggi-do (KR)

(72) Inventor: Stephen M. Harrison, Wallingford (GB)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 158 days.

(21) Appl. No.: 13/751,270

(22) Filed: Jan. 28, 2013

(65) Prior Publication Data

US 2013/0203603 A1 Aug. 8, 2013

(30) Foreign Application Priority Data

Feb. 6, 2012 (KR) ........................ 10-2012-0011797

(51) Int. Cl.
*H01F 6/06* (2006.01)
*G01R 33/035* (2006.01)
*H01F 6/04* (2006.01)

(52) U.S. Cl.
CPC ........................................ *H01F 6/04* (2013.01)

(58) Field of Classification Search
CPC .............. H01L 39/225; H01L 39/2496; G01R 33/0358; G01R 33/0352
See application file for complete search history.

(56) References Cited

U.S. PATENT DOCUMENTS 5,842,348 A * 12/1998 Kaneko et al. ................. 62/51.1
7,224,250 B2 5/2007 Nemoto et al.
2012/0094840 A1* 4/2012 Tanaka et al. ................. 505/211

FOREIGN PATENT DOCUMENTS

JP 2010-283186 A 12/2010
KR 10-0175113 B1 3/1999
KR 10-2005-0105276 A 11/2005

* cited by examiner

*Primary Examiner* — Colleen Dunn

(74) *Attorney, Agent, or Firm* — Cha & Reiter, LLC.

(57) ABSTRACT

A cryocooler system and a superconducting magnet apparatus having the cryocooler system include a cryocooler having a cool stage that cools a heat shielding unit and a thermal inertia that thermally contacts the cool stage of the cryocooler and has a high heat capacity. The cryocooler system reduces a temperature-increasing rate in a current lead by using the thermal inertia member when the temperature in the current lead is increased due to heat generated when an electrical current applied to a superconducting coil is ramped-up or ramped-down.

25 Claims, 5 Drawing Sheets

CRYOCOOLER SYSTEM AND SUPERCONDUCTING MAGNET APPARATUS HAVING THE SAME

CLAIM OF PRIORITY

This application claims, pursuant to 35 U.S.C. 119(a), priority to and the benefit of the earlier filing date of Korean Patent Application No. 10-2012-0011797, filed on Feb. 6, 2012, in the Korean Intellectual Property Office, the disclosure of which is incorporated herein in its entirety by reference.

BACKGROUND OF THE INVENTION

1. Field of the Invention

The present invention relates to a cryocooler system and a superconducting magnet apparatus having the same.

2. Description of the Related Art

In the prior art, a magnetic resonance imaging (MRI) apparatus uses a superconducting magnet. Because a superconducting magnet maintains a superconducting state at an ultra-low temperature such as 4.2 K, a cooling system for maintaining the ultra-low temperature is required.

A two-stage cryocooler that is conventionally employed in a cooling system in the prior art includes a first stage unit that operates at a temperature, for example, in a range from 40 K to 50 K and a second stage unit that operates at a temperature, for example, of 4 K. The second stage unit cools a superconducting body by directly and indirectly thermally contacting the superconducting body, for example, a superconducting coil, and the first stage unit cools a heat shielding unit that reduces heat transfer between room temperature and the superconducting body.

In a cooling system of an MRI apparatus of the prior art, heat is generated from a resistance of current leads when a superconducting magnet is ramped-up or ramped-down to generate or to turn off the resulting magnetic field. Accordingly, a cooling system needs to provide against the heat generated from the current leads. In the prior art, a bath cooling system has been used for cooling the superconducting magnet. In the bath cooling system, the heat generated when the superconducting magnet is ramped-up or ramped-down is cooled by placing the current leads in a flow of helium vapor that is vaporized from a liquid helium supplier. However, the bath cooling system uses an excessive amount of helium. In the case of a cooling system such as a thermosiphon method or a cryogen-free method, the cooling of the helium vapor is not useful and the heat generated when the superconducting magnet is ramped-up or ramped-down may not be sufficiently cooled due to the limited cooling capability of a cooler.

SUMMARY OF THE INVENTION

The present invention provides a cryocooler system having a structure in which a temperature-increasing rate in a current lead is reduced when heat is generated while a current is ramped-up or ramped-down, and a superconducting magnet apparatus having the same.

According to an aspect of the present invention, there is provided a cryocooler system including: a heat shielding unit that thermally shields a superconducting body; a cryocooler having a cool stage that cools the heat shielding unit; and a thermal inertia member that thermally contacts the cool stage of the cryocooler and has a high heat capacity.

The thermal inertia member may be formed of at least a metal selected from the group consisting of W, Pb, Cu, and Al or a non-metal selected from the group consisting of water, ice, hydrocarbon, wax, and solid nitrogen. The metal such as W, Pb, Cu, and Al or the non-metal that is solid at room temperature may thermally contact a first stage unit of the cryocooler, and the non-metal such as water, ice, hydrocarbon, wax, and solid nitrogen may thermally contact the first stage unit of the cryocooler and is stored in a storage unit.

The thermal inertia member may be disposed to surround at least a portion of a perimeter or outer surface of the cool stage of the cryocooler.

The thermal inertia member may be disposed close to a region of the heat shielding unit that contacts the cool stage of the cryocooler.

The thermal inertia member may be formed by increasing a thickness of the heat shielding unit at a region where the heat shielding unit contacts the cool stage of the cryocooler.

The cryocooler may be a two-stage cooler having a superconducting body-cooling stage unit that cools the superconducting body. Also, the cryocooler may additionally include a superconducting body cooler for cooling the superconducting body.

The cryocooler may cool the superconducting body by using a thermosiphon method. For example, the cryocooler system may further include: a sealing container to which the superconducting body-cooling stage unit is inserted and that comprises a coolant; and a heat exchange tube that is connected to the sealing container so that the coolant flows in and out and cools the superconducting body by thermally contacting the superconducting body through heat convention.

The cryocooler may cool the superconducting body by using a cryogen-free method. For example, the superconducting body cooling stage unit of the cryocooler may be thermally connected to the superconducting body directly or through a thermal conductive member having a high thermal conductivity.

The cryocooler system may further include a current lead that thermally contacts the cool stage of the cryocooler and supplies a current to the superconducting body. The thermal inertia member may reduce a temperature-increasing rate in the current lead by thermally contacting the current lead when the temperature of the current lead is increased due to heat generated by a current that flows through the current lead. The current lead may include a first current lead disposed around the heat shielding unit and a second current lead disposed within the heat shielding unit, and the heat shielding unit vacuum seals the superconducting body and the second current lead therein.

According to another aspect of the present invention, there is provided a superconducting magnet apparatus including: a superconducting coil; a heat shielding unit that shields the superconducting coil; a cryocooler having a cool stage for cooling the heat shielding unit; a current lead that thermally contacts the cool stage of the cryocooler and supplies a current to the superconducting coil; and a thermal inertia member that thermally contacts the cool stage of the cryocooler and has a high heat capacity.

The cryocooler system and a superconducting magnet apparatus may reduce a temperature increase due to heat generated while a current is ramped-up or ramped-down to a superconducting coil. Accordingly, the cryocooler system may reduce the rate of a temperature increase in the cool stage of the cryocooler while heat is generated when a superconducting coil is ramped-up or ramped-down without using helium vapor which is difficult to use in a cooling system that uses a thermosiphon method or a cryogen-free method, and thus, prevent the cryocooler system from overheating of the current lead.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
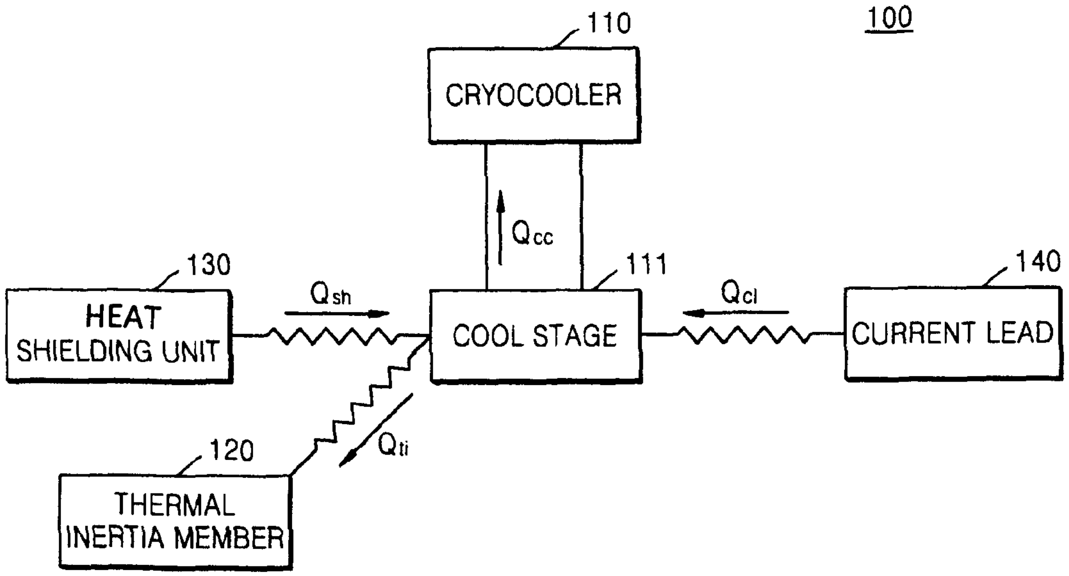
FIG. 1 is a schematic diagram showing a cryocooler system according to an exemplary embodiment of the present invention.

Hereinafter, preferred embodiments of present invention will be described more fully with reference to the accompanying drawings, in which exemplary embodiments of the present invention are shown. In the drawings, the thicknesses of layers and regions are exaggerated for clarity. Like reference numerals in the drawings denote like elements. In the following description, a detailed explanation of known related functions and constructions may be omitted to avoid unnecessarily obscuring the subject matter of the present invention. This invention may, however, be embodied in many different forms and should not be construed as limited to the exemplary embodiments set forth herein. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

FIG. 1 is a schematic diagram showing a cryocooler system 100 according to an exemplary embodiment of the present invention.

Referring to FIG. 1, the cryocooler system 100 includes a cryocooler 110, a thermal inertia member 120, and a heat shielding unit 130. The heat shielding unit 130 surrounds a superconducting body and shields heat from the surroundings. The heat shielding unit 130 may be formed of, for example, aluminum, and prevents heat from the outside from being conveyed to the superconducting body.

The cryocooler 110 includes a cool stage 111 that cools the heat shielding unit 130 by thermally contacting the heat shielding unit 130. The cryocooler 110 may be a two-stage cooler having a first stage unit that cools the heat shielding unit 130 and a second stage unit 212 as shown, for example, in FIG. 2, that cools a superconducting body shown in FIG. 2. The first stage unit and the second stage unit 212 of the two-stage cooler are operated at different temperatures. For example, the first stage unit may be operated at a temperature in a range from 40 K to 50 K, and the second stage unit 212 may be operated at a temperature of 4 K. In the exemplary embodiment shown in FIG. 1, the cool stage 111 may be the first stage unit of the two-stage cooler. The cool stage 111 of the cryocooler 110, that is, the first stage unit of the two-stage cooler, may cool the heat shielding unit 130 by thermally contacting the heat shielding unit 130, and the second stage unit 212 cools the superconducting body by directly and/or indirectly thermally contacting the superconducting body. The cryocooler 110 may be a cooler of three stages or more, and the cool stage 111 may be one of the stages that thermally contacts the heat shielding unit 130. Also, the cryocooler 110 may only cool the heat shielding unit 130, and a superconducting body cooler 520 as shown, for example, in FIG. 5, for cooling the superconducting body may be additionally provided. The cryocooler 110 may be a well-known cooler in the prior art such as a Gifford-McMahon (GM) cooler or a Pulse Tube cooler.

The thermal inertia member 120 may be formed of a high heat capacity material (HHCM), and is thermally connected to the cool stage 111 of the cryocooler 110. The thermal inertia member 120 may be a member additionally attached to the cool stage 111, and may be an existing constituent element that is located relatively close to the cool stage 111. The HHCM to be used for forming the thermal inertia member 120 may be formed of a metal selected from the group consisting of W, Pb, Cu, and Al or a non-metal selected from the group consisting of water, ice, hydrocarbon, wax, and solid nitrogen. The selection of a material for forming the thermal inertia member 120 may vary according to technical performance, cost, solubility, and processability. The thermal inertia member 120 reduces a rapid temperature increase of the cool stage 111 of the cryocooler 110 and the heat shielding unit 130 that thermally contacts the cool stage 111.

When the cryocooler system 100 according to the exemplary embodiment of FIG. 1 is applied to a superconducting magnet apparatus, the cryocooler system 100 may further include a current lead 140 that ramps-up or ramps-down an electrical current to a superconducting coil, which is a superconducting body. The current lead 140 is electrically connected to the superconducting coil, passing through the heat shielding unit 130 from the outside of the heat shielding unit 130. A portion of the current lead 140 is disposed to thermally contact the cool stage 111 of the cryocooler 110 and the thermal inertia member 120. Heat may be generated from a resistance of the current lead 140 while a current is ramped-up or ramped-down to the superconducting coil. Therefore, the cool stage 111 of the cryocooler 110 may cool a warm end of the current lead 140. Also, the thermal inertia member 120 performs a function of preventing the current lead 140 from rapidly increasing in temperature by heat.

Next, an operation of the cryocooler system 100 according to the exemplary embodiment of the present invention will be described.

In normal operation, an electrical current does not flow in the current lead 140, and the cool stage 111 of the cryocooler 110, the thermal inertia member 120, the heat shielding unit 130, and the current lead 140 are in a thermal equilibrium state. That is, in normal operation, the heat shielding unit 130 transfers a thermal load of shield heat $Q_{sh}$ per hour to the cool stage 111 of the cryocooler 110, and the current lead 140 transfers a thermal load of current lead heat $Q_{cl}$ per hour to the cool stage 111 of the cryocooler 110. At this point, heat that is transferred to the cool stage 111 of the cryocooler 110 satisfies Equation 1 below to establish a thermal equilibrium with a cooling capability $Q_{cc}$ of the cryocooler 110.

$$Q_{cc}=Q_{sh}+Q_{cl} \quad (1)$$

Also, when a temperature of the cool stage 111 of the cryocooler 110 is T1, a temperature of the thermal inertia member 120 is T2, a temperature of the heat shielding unit 130 is T3, and a temperature of the current lead 140, which may be a temperature of the current lead 140 that thermally contacts the cool stage 111 of the cryocooler 110, is T4, in normal operation, the thermal inertia member 120 and the cool stage 111 of the cryocooler 110 may have an equal temperature, and accordingly, there is no substantial thermal transfer between the thermal inertia member 120 and the cool stage 111 of the cryocooler 110. That is, in normal operation, Equation 2 and Equation 3 are satisfied.

$$T3=T1 \quad (2)$$

$$Q_{ti}=0 \quad (3)$$

where, $Q_{ti}$ is heat transferred into or from the cool stage 111 of the cryocooler 110.

A portion of the current lead 140 where an electrical current flows generates heat. The heat generated from the portion of the current lead 140 is transferred to the cool stage 111 of the cryocooler 110.

While a current is ramped-up or ramped-down to the superconducting coil, a current flows in the current lead 140. Even though a portion of the current lead 140 that is in the heat shielding unit 130 is formed of a superconducting body, which may be a high temperature superconducting body, portions of the current lead 140 outside of the heat shielding unit 130 and a portion that contacts the heat shielding unit 130 have resistances. Therefore, while a current is ramped-up or ramped-down to the superconducting coil, heat is generated from the resistances of the current lead 140. The heat increases by ΔQ per unit hour transferring to the cryocooler 110 from the current lead 140. That is, when an electrical current is supplied, the cryocooler system 100 is in a state as defined by Equation 4 below.

$$Q_{cc}<Q_{sh}+Q_{cl}+\Delta Q \quad (4)$$

As shown in Equation 4, heat transferred to the cool stage 111 of the cryocooler 110 is greater than a cooling capacity of the cryocooler 110. Thus, the temperature of the cool stage 111 of the cryocooler 110 increases. However, a portion of heat that is transferred to the cool stage 111 of the cryocooler 110 is transferred to the thermal inertia member 120, and thus, the temperature-increasing rate of the cool stage 111 of the cryocooler 110 is reduced by the thermal inertia member 120. That is, when a current is supplied to the superconducting coil, the temperature-increasing rate of the cool stage 111 of the cryocooler 110 satisfies Equation 5 below.

$$\frac{dT1}{dt}=\frac{\Delta Q}{M_{ti}\times C_{ti}} \quad (5)$$

where $M_{ti}$ and $C_{ti}$ indicate mass and specific heat capacity of the thermal inertia member 120, respectively. The right-side of the Equation 5 shows an approximate value at which a thermal capacity of the cool stage 111 of the cryocooler 110 is neglected since the thermal capacity of the thermal inertia member 120 is sufficiently large.

Equation 5 shows that the larger the thermal capacity of the thermal inertia member 120, the temperature-increasing rate of the cool stage 111 of the cryocooler 110 is reduced. Accordingly, the temperature-increasing rate of the cool stage 111 of the cryocooler 110 may be reduced by appropriately selecting a material and size of the thermal inertia member 120 so that a current is ramped-up or ramped-down to a superconducting coil without an excessive temperature increase of the current lead 140.

Figure 2:
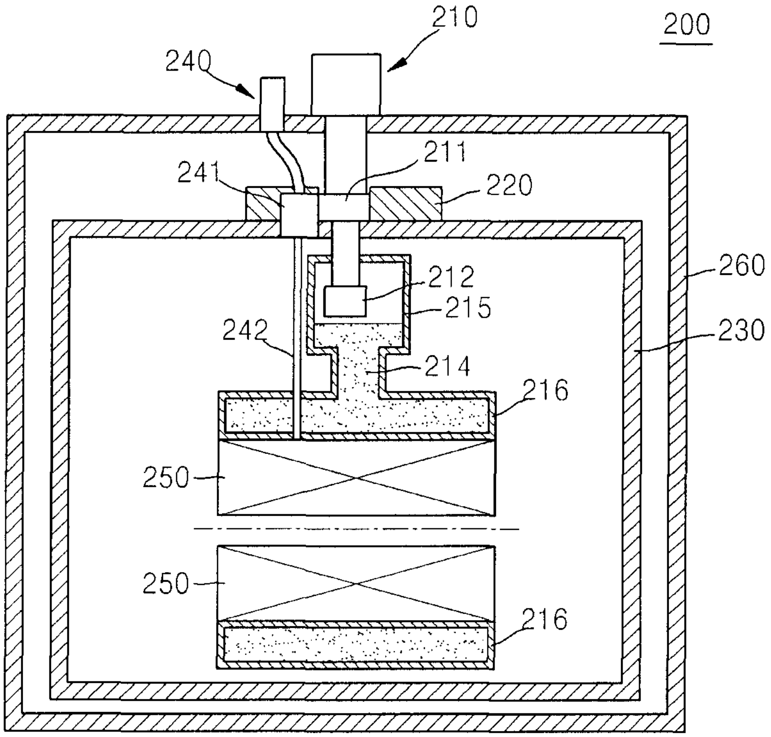
FIG. 2 is a schematic diagram showing a superconducting magnet apparatus according to the exemplary embodiment of the present invention.

FIG. 2 is a schematic diagram showing a superconducting magnet apparatus 200 according to the exemplary embodiment of the present invention.

Referring to FIG. 2, the superconducting magnet apparatus 200 according to the exemplary embodiment includes a superconducting coil 250 which is a superconducting body, a heat shielding unit 230 that thermally shields the superconducting coil 250 from heat, a cryocooler system that cools the superconducting coil 250, and a current lead 240 that ramps-up or ramps-down a current to the superconducting coil 250. The cryocooler system includes a cryocooler 210 and a thermal inertia member 220. The heat shielding unit 230 may be a vacuum container that shields the superconducting coil 250 in a vacuum state. The cryocooler 210, the thermal inertia member 220, and the current lead 240 may be sealed by a housing 260. The housing 260 may shield the heat shielding unit 230, that is cooled by the cryocooler 210, from room temperature or other ambient temperature at the facility in which the superconducting magnet apparatus 200 is located. The housing 260 may also be a vacuum container.

The superconducting coil 250 may be formed of a low-temperature superconducting body or a high-temperature superconducting body. When a current is supplied to the superconducting coil 250, for example, from the current lead 240, the superconducting coil 250 becomes a superconducting magnet.

The cryocooler 210 may be a two-stage cryocooler that includes a first stage unit 211 and a second stage unit 212. The first stage unit 211 of the cryocooler 210 cools the heat shielding unit 230 by thermally contacting the heat shielding unit 230. The cryocooler 210 cools the superconducting coil 250 by using a thermosiphon method known in the art. As an example, the second stage unit 212 of the cryocooler 210 is disposed inside of a sealed container 215. The sealed container 215 is connected to a heat exchange tube 216 so that a coolant 214 flows in and out. The heat exchange tube 216 is disposed to surround at least a portion of the superconducting coil 250. The coolant 214 may be helium, neon, or nitrogen, and may be selected according to the cooling temperature.

The thermal inertia member 220 may be formed of an HHCM, is additionally physically attached to the first stage unit 211 of the cryocooler 210, and is thermally connected to the first stage unit 211 of the cryocooler 210. For example, the thermal inertia member 220 may be disposed to surround at least a portion of a perimeter or outer surface of the first stage unit 211 at a region where the first stage unit 211 of the cryocooler 210 cools the heat shielding unit 230. The thermal inertia member 220 may be a storage unit or container formed of a metal selected from the group consisting of W, Pb, Cu, and Al or a non-metal selected from the group consisting of water, ice, hydrocarbon, wax, and solid nitrogen. The thermal inertia member 220 may reduce a rapid temperature increase of the first stage unit 211 of the cryocooler 210.

The current lead 240 may include a first current lead 241 that is disposed between the housing 260 and the heat shielding unit 230, and a second current lead 242 that is electrically connected to the superconducting coil 250 within the heat shielding unit 230. At least a portion of the first current lead 241 of the current lead 240 is disposed to thermally contact the first stage unit 211 of the cryocooler 210 and the thermal inertia member 220. The first current lead 241 may be formed of, for example, a metal having a high conductivity, such as copper or brass. The second current lead 242 may be formed of, for example, a metal having a high conductivity, such as copper or brass or a high-temperature superconducting body. In the case of the first current lead 241, even though a material having a high conductivity is used, the first current lead 241 has a resistance. Accordingly, when a current flows through the first current lead 241, heat is generated in the first current lead 241. In the case of the second current lead 242, if the second current lead 242 is formed of a superconducting body, heat may be neglected. However, when the second current lead 242 is formed of copper or brass, heat may be generated by its resistance.

Next, an operation of the superconducting magnet apparatus 200 according to the exemplary embodiment is described.

In normal operation, the coolant 214 cooled by the first stage unit 211 of the cryocooler 210 cools the superconducting coil 250 by heat transfer through natural thermal convection or direct contact. Accordingly, the superconducting coil 250 remains in a superconducting state. In a permanent mode in which a current flows in the superconducting coil 250, the superconducting coil 250 becomes a superconducting magnet. The coolant 214 that is warmed by heat obtained from cooling the superconducting coil 250 flows into the sealed container 215 by thermal convection and is cooled by the second stage unit 212 of the cryocooler 210.

The first stage unit 211 of the cryocooler 210 thermally blocks the outside and the inside by cooling the heat shielding unit 230. At this point, heat is not generated from the current lead 240 since a current does not flow through the current lead 240, and the first stage unit 211 of the cryocooler 210 and the peripheral members, for example, the thermal inertia member 220, the heat shielding unit 230, and the current lead 240, are in a thermal equilibrium state.

When a current is ramped-up or ramped-down to the superconducting coil 250, a current flows through the current lead 240 and heat is generated from a resistance of the current lead 240. In a thermosiphon method as in the cryocooler system according to the exemplary embodiment of FIG. 2, a coolant that cools the superconducting coil 250 moves through the sealed heat exchange tube 216. Therefore, vapor cooling that is used in a bath cooling method is not useful for cooling heat generated from the current lead 240. Thus, the superconducting magnet apparatus 200 according to the exemplary embodiment of FIG. 2 reduces the temperature-increasing rate of the first stage unit 211 of the cryocooler 210 by using the thermal inertia member 220 while a current is ramped-up or ramped-down. Therefore, known thermal problems such as quenching, due to heat generated while a current is ramped-up or ramped-down, may be reduced by the present invention.

Figure 3:
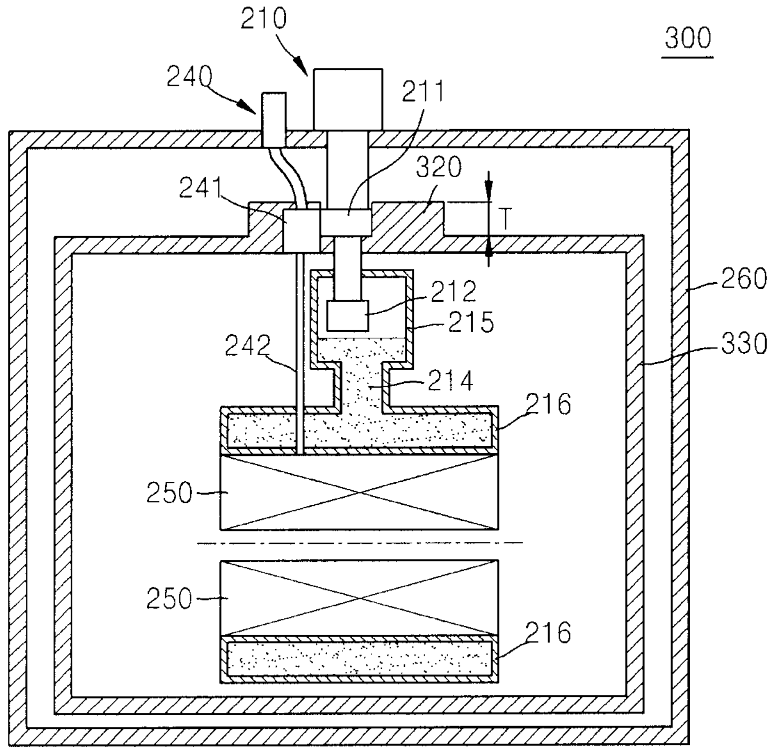
FIG. 3 is a schematic diagram showing a superconducting magnet apparatus according to another exemplary embodiment of the present invention.

FIG. 3 is a schematic diagram showing a superconducting magnet apparatus 300 according to another exemplary embodiment of the present invention.

Referring to FIG. 3, the superconducting magnet apparatus 300 according to the exemplary embodiment includes a cryocooler system that includes the cryocooler 210, a thermal inertia member 320, a heat shielding unit 330, the current lead 240, the superconducting coil 250, and the housing 260.

The superconducting magnet apparatus 300 is substantially the same as the superconducting magnet apparatus 200 described with reference to FIG. 2 except that the thermal inertia member 320 and the heat shielding unit 330 are formed as one body. That is, the thermal inertia member 320 according to the exemplary embodiment of FIG. 3 is formed by increasing a thickness T of the heat shielding unit 330 near a region where the heat shielding unit 330 thermally contacts the first stage unit 211 of the cryocooler 210, such that the heat shielding unit 330 near the contact region is relatively thick. A thermal capacity of a material is proportional to its specific heat that corresponds to physical properties of a material and the size of the material. Therefore, the thermal capacity of a corresponding portion may be increased by increasing the thickness T of the heat shielding unit 330 near a region where the heat shielding unit 330 thermally contacts the first stage unit 211 of the cryocooler 210. In this case, the material for forming the heat shielding unit 330 may have a relatively high specific heat.

Figure 4:
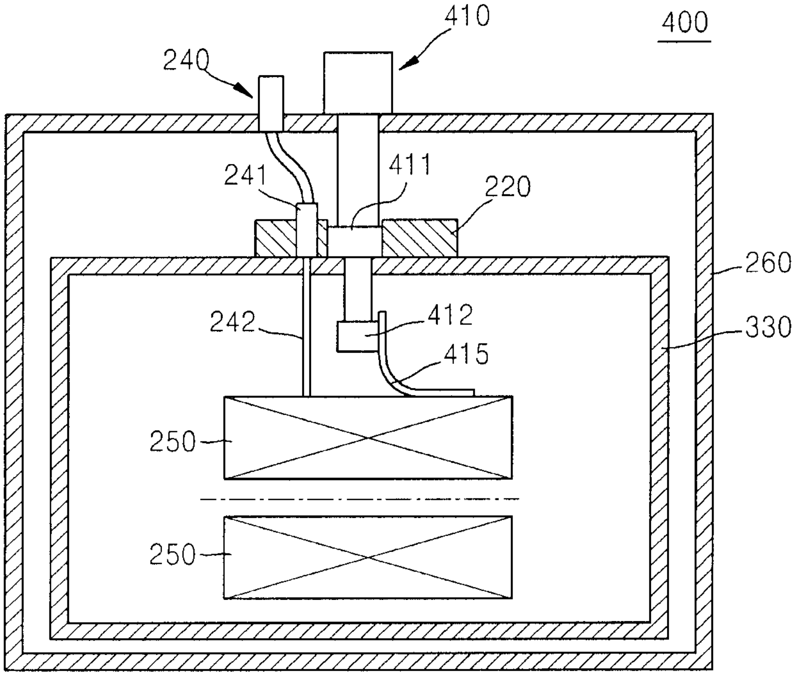
FIG. 4 is a schematic diagram showing a superconducting magnet apparatus according to a further exemplary embodiment of the present invention.

FIG. 4 is a schematic diagram showing a superconducting magnet apparatus 400 according to a further exemplary embodiment of the present invention.

Referring to FIG. 4, the superconducting magnet apparatus 400 according to the exemplary embodiment includes a cryocooler system that includes a cryocooler 410, the thermal inertia member 220, the heat shielding unit 230, the current lead 240, the superconducting coil 250, and the housing 260.

The superconducting magnet apparatus 400 is substantially the same as the superconducting magnet apparatus 200 described with reference to FIG. 2 except that the cryocooler 410 is a cryogen-free cooler. That is, a second stage unit 412 of the cryocooler 410 of the exemplary embodiment of FIG. 4 is disposed to directly thermally contact the superconducting coil 250 through a heat transfer member 415 having a high thermal conductivity. In some cases, the second stage unit 412 of the cryocooler 410 may directly thermally contact the superconducting coil 250 without the heat transfer member 415. The superconducting magnet apparatus 400 is substantially the same as the exemplary embodiment in FIG. 3 in that a first stage unit 411 of the cryocooler 410 cools the heat shielding unit 230 and thermally contacts the thermal inertia member 220. Accordingly, even though the superconducting coil 250 is cooled by a cryogen-free method, the function of the thermal inertia member 220 is the same as described above. Accordingly, the superconducting magnet apparatus 400 according to the exemplary embodiment also reduces the temperature-increasing rate of the first stage unit 411 of the cryocooler 410 by using the thermal inertia member 220 while a current is ramped-up or ramped-down. Therefore, known thermal problems such as quenching due to heat generated while a current is ramped-up or ramped-down may be reduced.

In the above embodiments, the cryocooler system is described using a thermosiphon method or a cryogen-free method. However, the cooling system according to the present invention is not limited thereto. For example, in a bath cooling system, a thermal inertia member may thermally connect with a first stage unit of the cryocooler.

Figure 5:
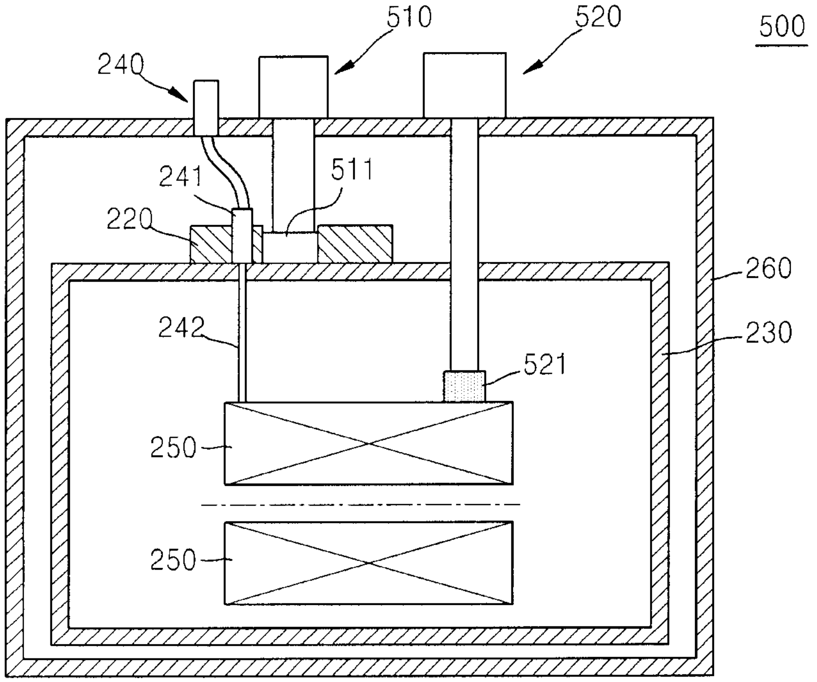
FIG. 5 is a schematic diagram showing a superconducting magnet apparatus according to an additional exemplary embodiment of the present invention.

FIG. 5 is a schematic diagram showing a superconducting magnet apparatus 500 according to an additional exemplary embodiment of the present invention.

Referring to FIG. 5, the superconducting magnet apparatus 500 includes a cryocooler system that includes a heat shielding unit cooler 510, the thermal inertia member 220, a superconducting body cooler 520, the heat shielding unit 230, the current lead 240, the superconducting coil 250, and the housing 260.

The superconducting magnet apparatus 500 is substantially the same as the superconducting magnet apparatus 200 described with reference to FIG. 2 except that the heat shielding unit cooler 510 and the superconducting body cooler 520 are separated from each other. That is, in the exemplary embodiment of FIG. 5, the heat shielding unit cooler 510 cools the heat shielding unit 230, and the superconducting body cooler 520 is structurally separated from the heat shielding unit cooler 510 and cools the superconducting coil 250. A cool stage 511 of the heat shielding unit cooler 510 thermally contacts the thermal inertia member 220 and the heat shielding unit 230, and may correspond to the first stage unit of the two-stage cooler as described in the previous exemplary embodiments. A superconducting body cooler stage unit 521 of the superconducting body cooler 520 may correspond to the second stage unit of the two-stage cooler. As a cooling method for the superconducting body cooler 520, a thermosiphon method or a cryogen-free method as described with references to FIGS. 2 and 4 may be employed, and a bath cooling method may also be employed.

The superconducting magnet apparatus 500 is substantially the same as in the previous exemplary embodiments in that the cool stage 511 of the heat shielding unit cooler 510 cools the heat shielding unit 230 and thermally contacts the thermal inertia member 220, and the function of the thermal inertia member 220 is also the same as described above. Accordingly, the superconducting magnet apparatus 500 according to the exemplary embodiment of FIG. 5 also reduces the temperature-increasing rate of the cool stage 511 of the heat shielding unit cooler 510 by using the thermal inertia member 220 while a current is ramped-up or ramped-down. Therefore, known thermal problems such as quenching due to heat generated while a current is ramped-up or ramped-down may be reduced.

The superconducting magnet apparatuses 200, 300, 400, and 500 according to the exemplary embodiments of the present invention may be magnetic resonance imaging (MRI) apparatuses or superconducting magnet apparatuses for magnetic levitation locomotives. For example, if the superconducting magnet apparatuses 200, 300, 400, and 500 are MRI apparatuses, the superconducting magnet apparatuses 200, 300, 400, and 500 may further include a gradient coil and/or a radio frequency (RF) coil.

While a cryocooler system and a superconducting magnet apparatus according to the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cryocooler system comprising:

a heat shielding unit that thermally shields a superconducting body;

a cryocooler having a cool stage that cools the heat shielding unit;

a thermal inertia member that thermally contacts the cool stage of the cryocooler and has a relatively high heat capacity; and a current lead that thermally contacts the cool stage of the cryocooler and supplies an electrical current to the superconducting body, wherein the thermal inertia member reduces a rate of a temperature increase in the current lead by thermally contacting the current lead when the temperature of the current lead increases due to heat generated by the electrical current that flows through the current lead.

2. The cryocooler system of claim 1, wherein the thermal inertia member is formed of at least a metal selected from the group consisting of W, Pb, Cu, and Al or a non-metal selected from the group consisting of water, ice, hydrocarbon, wax, and solid nitrogen.

3. The cryocooler system of claim 1, wherein the thermal inertia member is disposed to surround at least a portion of an outer surface of the cool stage of the cryocooler.

4. The cryocooler system of claim 1, wherein the thermal inertia member is disposed adjacent a region of the heat shielding unit that contacts the cool stage of the cryocooler.

5. The cryocooler system of claim 1, wherein the thermal inertia member is formed by increasing a thickness of the heat shielding unit at a region where the heat shielding unit contacts the cool stage of the cryocooler.

6. The cryocooler system of claim 1, wherein the cryocooler is a two-stage cooler having a superconducting body-cooling stage unit that cools the superconducting body.

7. A crvocooler system comprising:

a heat shielding unit that thermally shields a superconducting body;

a crvocooler having a cool stage that cools the heat shielding unit;

a thermal inertia member that thermally contacts the cool stage of the cryocooler and has a relatively high heat capacity, wherein the cryocooler is a two-stage cooler having a superconducting body-cooling stage unit that cools the superconducting body, and wherein the cryocooler cools the superconducting body by using a thermosiphon method.

8. The cryocooler system of claim 7, further comprising:

a sealing container in which the superconducting body-cooling stage unit is positioned and that comprises a coolant; and a heat exchange tube that is connected to the sealing container so that the coolant flows in and out of the sealing container, and that cools the superconducting body through heat convention by thermally contacting the superconducting body.

9. A cryocooler system comprising:

a heat shielding unit that thermally shields a superconducting body;

a cryocooler having a cool stage that cools the heat shielding unit: and a thermal inertia member that thermally contacts the cool stage of the cryocooler and has a relatively high heat capacity, wherein the cryocooler is a two-stage cooler having a superconducting body-cooling stage unit that cools the superconducting body, and wherein the cryocooler cools the superconducting body by using a cryogen-free method.

10. The cryocooler system of claim 9, wherein the superconducting body-cooling stage unit of the cryocooler is thermally connected to the superconducting body directly or through a thermal conductive member having a relatively high thermal conductivity.

11. The cryocooler system of claim 1, further comprising a superconducting body cooler that cools the superconducting body.

12. The cryocooler system of claim 1, wherein the current lead comprises a first current lead disposed external to the heat shielding unit and a second current lead disposed within the heat shielding unit, and the heat shielding unit is vacuum sealed with the superconducting body and the second current lead therein.

13. A superconducting magnet apparatus comprising:

a superconducting coil;

a heat shielding unit that thermally shields the superconducting coil;

a cryocooler having a cool stage for cooling the heat shielding unit;

a current lead that thermally contacts the cool stage of the cryocooler and supplies an electrical current to the superconducting coil; and a thermal inertia member that thermally contacts the cool stage of the cryocooler and has a relatively high heat capacity, wherein the thermal inertia member reduces a temperature-increasing rate in the current lead by thermally contacting the current lead when the temperature of the current lead is increased due to heat generated by the electrical current that flows through the current lead.

14. The superconducting magnet apparatus of claim 13, wherein the thermal inertia member is formed of at least a metal selected from the group consisting of W, Pb, Cu, and Al or a non-metal selected from the group consisting of water, ice, hydrocarbon, wax, and solid nitrogen.

15. The superconducting magnet apparatus of claim 13, wherein the thermal inertia member is disposed to surround at least a portion of an outer surface of the cool stage of the cryocooler.

16. The superconducting magnet apparatus of claim 13, wherein the thermal inertia member is disposed relatively close to a region of the heat shielding unit that contacts the cool stage of the cryocooler.

17. The superconducting magnet apparatus of claim 13, wherein the thermal inertia member has a relatively high thickness of the heat shielding unit at a region where the heat shielding unit contacts the cool stage of the cryocooler.

18. The superconducting magnet apparatus of claim 13, wherein the cryocooler is a two-stage cooler having a superconducting body-cooling stage unit that cools the superconducting body.

19. A superconducting magnet apparatus comprising:

a superconducting coil;

a heat shielding unit that thermally shields the superconducting coil;

a cryocooler having a cool stage for cooling the heat shielding unit; and a thermal inertia member that thermally contacts the cool stage of the cryocooler and has a relatively high heat capacity, wherein the cryocooler is a two-stage cooler having a superconducting body-cooling stage unit that cools the superconducting body, and wherein the cryocooler cools the superconducting body by using a thermosiphon method.

20. The superconducting magnet apparatus of claim 19, further comprising:

a sealing container in which the superconducting body-cooling stage unit is positioned and that comprises a coolant; and a heat exchange tube that is connected to the sealing container so that the coolant flows in and out of the sealing container and that cools the superconducting body through heat convention by thermally contacting the superconducting body.

21. A superconducting magnet apparatus comprising:

a superconducting coil;

a heat shielding unit that thermally shields the superconducting coil;

a cryocooler having a cool stage for cooling the heat shielding unit; and a thermal inertia member that thermally contacts the cool stage of the cryocooler and has a relatively high heat capacity, wherein the cryocooler is a two-stage cooler having a superconducting body-cooling stage unit that cools the superconducting body, and wherein the cryocooler cools the superconducting body by using a cryogen-free method.

22. The superconducting magnet apparatus of claim 21, wherein the superconducting body cooling stage unit of the cryocooler is thermally connected to the superconducting body directly or through a thermal conductive member having a relatively high thermal conductivity.

23. The superconducting magnet apparatus of claim 13, further comprising a superconducting body cooler that cools the superconducting body.

24. The superconducting magnet apparatus of claim 13, wherein the current lead comprises a first current lead disposed external to the heat shielding unit and a second current lead disposed within the heat shielding unit, and the heat shielding unit is vacuum sealed with a superconducting body and the second current lead therein.

25. The superconducting magnet apparatus of claim 13, wherein the superconducting magnet apparatus is a magnetic resonance imaging (MRI) apparatus or a superconducting magnet apparatus for magnetic levitation locomotives.

* * * * *

UNITED STATES PATENT AND TRADEMARK OFFICE

CERTIFICATE OF CORRECTION

PATENT NO. : 9,014,769 B2
APPLICATION NO. : 13/751270
DATED : April 21, 2015
INVENTOR(S) : Stephen M. Harrison It is certified that error appears in the above-identified patent and that said Letters Patent is hereby corrected as shown below:

In the Claims

Column 10, Claim 7, Line 14 should read as follows:
--...A cryocooler system comprising...--

Column 10, Claim 7, Line 17 should read as follows:
--...a cryocooler having a...--

Signed and Sealed this
Twenty-first Day of July, 2015

Michelle K. Lee
*Director of the United States Patent and Trademark Office*